(12) United States Patent
Liu et al.

(10) Patent No.: US 11,360,623 B2
(45) Date of Patent: Jun. 14, 2022

(54) TOUCH SENSOR AND ELECTRONIC DEVICE

(71) Applicants:CHENGDU BOE OPTOELECTRONICS TECHNOLOGY CO., LTD., Sichuan (CN); BOE TECHNOLOGY GROUP CO., LTD., Beijing (CN)

(72) Inventors: Xiaoxia Liu, Beijing (CN); Fuzheng Xie, Beijing (CN); Hongqiang Luo, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 668 days.

(21) Appl. No.: 16/327,044

(22) PCT Filed: Aug. 14, 2018

(86) PCT No.: PCT/CN2018/100425
§ 371 (c)(1),
(2) Date: Feb. 21, 2019

(87) PCT Pub. No.: WO2019/140896
PCT Pub. Date: Jul. 25, 2019

(65) Prior Publication Data
US 2021/0365149 A1    Nov. 25, 2021

(30) Foreign Application Priority Data

Jan. 16, 2018 (CN) .......................... 201810040408.X

(51) Int. Cl.
*G06F 3/044* (2006.01)
*G06F 3/041* (2006.01)
*H05K 1/18* (2006.01)

(52) U.S. Cl.
CPC .......... *G06F 3/0446* (2019.05); *G06F 3/0412* (2013.01); *G06F 3/0443* (2019.05);
(Continued)

(58) Field of Classification Search
CPC .... G06F 3/0446; G06F 3/0412; G06F 3/0443; G06F 2203/04102; H05K 1/189; H05K 2201/10151
See application file for complete search history.

(56) References Cited

U.S. PATENT DOCUMENTS 8,451,011 B2 *  5/2013  Hayakawa .............. G01L 1/142
                                                      324/658
10,014,352 B1 *  7/2018  Tsai .................... H01L 51/5253
(Continued)

FOREIGN PATENT DOCUMENTS

CN    204143398 U    2/2015
CN    205507727 U    8/2016
(Continued)

OTHER PUBLICATIONS

First Chinese Office Action dated Dec. 4, 2019; Appln. No. 201810040408.X.
(Continued)

*Primary Examiner* — Grant Sitta

(57) ABSTRACT

A touch sensor and an electronic device are provided, and the touch sensor includes a film substrate and a plurality of touch electrode regions on the film substrate. The plurality of touch electrode regions are spaced apart from each other by at least one gap region, and the touch sensor is bendable along the gap region. The touch sensor is bendable and is not (Continued)

easily damaged, which helps to achieve foldable touch control.

19 Claims, 6 Drawing Sheets

(52) U.S. Cl.
CPC .... *G06F 2203/04102* (2013.01); *H05K 1/189* (2013.01); *H05K 2201/10151* (2013.01)

(56) References Cited

U.S. PATENT DOCUMENTS

| | | | | |
|---|---|---|---|---|
| 2013/0342429 | A1* | 12/2013 | Choi | H04M 1/0268 |
| | | | | 29/846 |
| 2014/0098095 | A1* | 4/2014 | Lee | G09G 3/20 |
| | | | | 345/420 |
| 2014/0139447 | A1* | 5/2014 | Kang | G06F 3/04164 |
| | | | | 345/173 |
| 2015/0035777 | A1* | 2/2015 | Hirakata | G06F 3/0412 |
| | | | | 345/173 |
| 2015/0242022 | A1* | 8/2015 | Hung | G06F 3/04164 |
| | | | | 345/174 |
| 2015/0324046 | A1* | 11/2015 | Lo | G06F 3/041 |
| | | | | 345/173 |
| 2016/0188098 | A1* | 6/2016 | Her | G06F 3/04164 |
| | | | | 345/173 |
| 2016/0291780 | A1* | 10/2016 | Namkung | G02B 27/286 |
| 2016/0364048 | A1* | 12/2016 | Park | G06F 3/0445 |
| 2017/0131809 | A1* | 5/2017 | Lin | G06F 3/04164 |
| 2018/0182838 | A1* | 6/2018 | Yeo | H01L 27/1225 |
| 2018/0203531 | A1* | 7/2018 | Tsai | G06F 3/04164 |
| 2018/0348916 | A1 | 12/2018 | Park et al. | |
| 2019/0056812 | A1 | 2/2019 | Wang et al. | |
| 2019/0235681 | A1* | 8/2019 | Li | G06F 3/0412 |
| 2021/0181918 | A1* | 6/2021 | Wu | G06K 9/00013 |
| 2021/0365152 | A1* | 11/2021 | Xu | G06F 3/0412 |
| 2021/0405816 | A1* | 12/2021 | Niu | G06F 3/0446 |

FOREIGN PATENT DOCUMENTS

| | | |
|---|---|---|
| CN | 205750746 U | 11/2016 |
| CN | 106325626 A | 1/2017 |
| CN | 107450777 A | 12/2017 |
| CN | 107580088 A | 1/2018 |

OTHER PUBLICATIONS

International Search Report and Written Opinion dated Nov. 5, 2018; PCT/CN2018/100425.

* cited by examiner

TOUCH SENSOR AND ELECTRONIC DEVICE

This application claims the benefit of Chinese patent application No. 201810040408.X filed on Jan. 16, 2018, the disclosure of which is incorporated herein by reference as part of the application.

TECHNICAL FIELD

Embodiments of the present disclosure relate to a touch sensor and an electronic device.

BACKGROUND

With the development of technology, touch screens have become more and more widely used. The touch screens provide a simple and convenient way of human-computer interaction by replacing mechanical button panels with tactile feedback systems. According to different working principles, the touch screens include capacitive, resistive, infrared and surface acoustic wave type touch screens and the like.

Touch sensors are devices for implementing a touch detection function in the touch screens. The touch sensors can detect touch position information, convert the touch position information detected into an electrical signal according to a certain rule and then output the electrical signal, to meet touch detection requirements. According to different substrate materials, touch sensors include glass type touch sensors and thin film type touch sensors. The thin film type touch sensors have advantages of thin thickness and low cost and the like, and have gradually become one of the mainstream touch sensors in recent years.

SUMMARY

At least one embodiment of the present disclosure provides a touch sensor. The touch sensor comprises: a film substrate; a plurality of touch electrode regions arranged side by side on the film substrate. The plurality of touch electrode regions are spaced apart from each other by at least one gap region, and the touch sensor is bendable along the gap region.

For example, in the touch sensor according to an embodiment of the present disclosure, the plurality of touch electrode regions are not electrically connected with each other; the touch sensor further comprises a plurality of flexible circuit boards, the plurality of flexible circuit boards being electrically and correspondingly connected with the plurality of touch electrode regions to provide signal connections.

For example, in the touch sensor according to an embodiment of the present disclosure, the plurality of flexible circuit boards are on a same side or different sides of the plurality of touch electrode regions.

For example, the touch sensor according to an embodiment of the present disclosure comprises an electrical wire, the electrical wire extending across the gap region and electrically connecting the touch electrode regions on two sides of the gap region.

For example, in the touch sensor according to an embodiment of the present disclosure, a material of the electric wire comprises copper, aluminum, gold, silver or an alloy thereof.

For example, the touch sensor according to an embodiment of the present disclosure comprises a flexible circuit board electrically connected with any one of the touch electrode regions.

For example, in the touch sensor according to an embodiment of the present disclosure, an interval between two adjacent ones of the touch electrode regions is not greater than a product of a bending radius of the touch sensor and a circumference ratio.

For example, in the touch sensor according to an embodiment of the present disclosure, the plurality of touch electrode regions are arranged in a plurality of rows or in a plurality of columns.

For example, in the touch sensor according to an embodiment of the present disclosure, the touch electrode regions comprise a touch electrode structure, a material of the touch electrode structure comprising a transparent conductive material.

For example, in the touch sensor according to an embodiment of the present disclosure, the film substrate is a flexible substrate.

For example, the touch sensor according to an embodiment of the present disclosure comprises a flexible connector member, the flexible connector member being provided in the gap region and being connected with adjacent ones of the touch electrode regions to connect the plurality of touch electrode regions together.

For example, in the touch sensor according to an embodiment of the present disclosure, the touch sensor comprises a capacitive touch sensor.

At least one embodiment of the present disclosure also provides an electronic device, comprising any of the touch sensors.

For example, the electronic device according to an embodiment of the present disclosure comprises a display structure, the touch sensor and the display structure being arranged in layers.

For example, the electronic device according to an embodiment of the present disclosure comprises an optical adhesive bonding layer provided between the touch sensor and the display structure to bond the touch sensor and the display structure; and a flexible cover plate provided on the touch sensor.

For example, in the electronic device according to an embodiment of the present disclosure, the display structure comprises a display array of organic light-emitting diodes.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may relate only to some embodiments of the disclosure and are not intended to limit the present disclosure.

DETAILED DESCRIPTION

Figure 1:
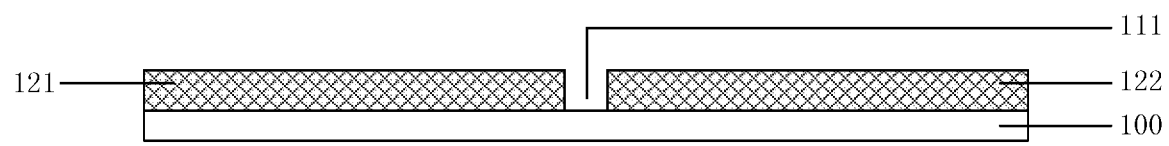
FIG. 1 is a cross-sectional view of a touch sensor according to an embodiment of the present disclosure.

In order to make objects, technical solutions and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, one of ordinary skill in the art can obtain other embodiment(s) without any creative work, which shall be within the scope of the disclosure.

Unless otherwise defined, all the technical and scientific terms used herein have the same meanings as commonly understood by one of ordinary skill in the art to which the present disclosure belongs. The terms "first," "second," or the like, which are used in the description and the claims of the present application for disclosure, are not intended to indicate any sequence, amount or importance, but to distinguish various components. The terms "comprise," "comprising," "include," "including," or the like, are intended to specify that the elements or the objects stated before these terms encompass the elements or the objects and equivalents thereof listed after these terms, but do not preclude other elements or objects. The terms "connect", "connected", or the like, are not intended to define a physical connection or mechanical connection, but may include an electrical connection, directly or indirectly. "On," "under," "right," "left" or the like are only used to indicate relative position relationship, and when the position of the object which is described is changed, the relative position relationship may be changed accordingly.

Based on the demands for flexible displays in the fields of smart phones, wearable smart devices, virtual reality, augmented reality or the like, flexible display technologies have gradually become the next generation of core display technologies. The development of touch screens and the development of display screens complement each other. With the development of the flexible display technologies, foldable touch screens have gradually become a research hotspot. The key to whether a touch screen can be folded is whether a touch sensor can be folded. For example, the touch sensor includes a base material and a transparent conductive material. For example, the base material may be a polymer film having a property of being soft and bendable. The transparent conductive material is hard and brittle, which is easily broken when it is deformed under a force and has poor bending property, and is difficult to meet the requirement of being bendable, so, it becomes an obstacle to the development of the foldable touch screens.

At least one embodiment of the present disclosure provides a touch sensor and an electronic device. The touch sensor has a plurality of touch electrode regions arranged side by side on a film substrate, and a gap region between adjacent ones of the touch electrode regions is bendable. In this way, the touch sensor can realize the function of bending and is not easy to be damaged, which helps to realize foldable touch control and to realize flexible display when the touch sensor is applied in a flexible display screen.

Hereinafter, embodiments of the present disclosure will be described in detail with reference to the accompanying drawings. It is to be noted that the same reference signs used in different drawings refer to the same described elements.

At least one embodiment of the present disclosure provides the touch sensor including the film substrate and the plurality of touch electrode regions arranged side by side on the film substrate. The plurality of touch electrode regions are spaced apart from each other through at least one gap region, and the touch sensor is bendable along the gap region.

Figure 2:
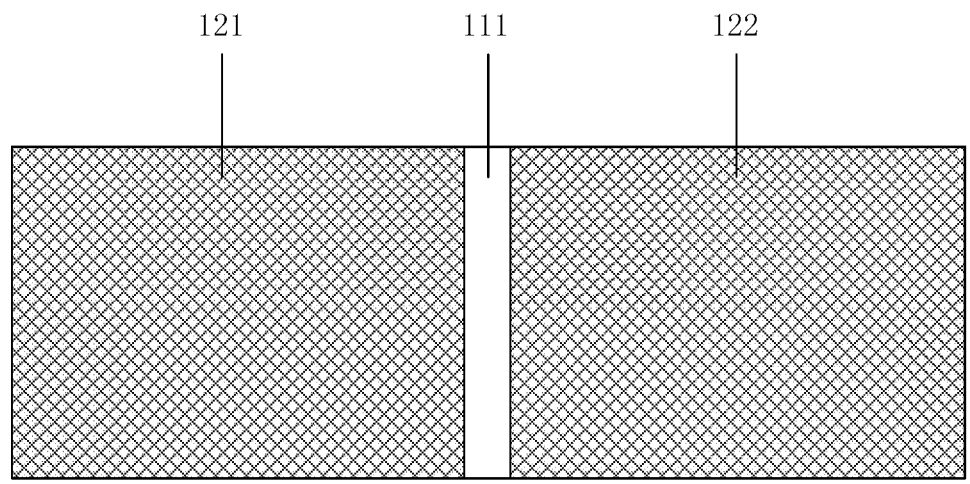
FIG. 2 is a schematic plan view of the touch sensor shown in FIG. 1 according to an embodiment of the present disclosure.

FIG. 1 is a schematic cross-sectional view of the touch sensor according to an embodiment of the present disclosure, and FIG. 2 is a schematic plan view of the touch sensor shown in FIG. 1 according to an embodiment of the present disclosure. Referring to FIGS. 1 and 2, the touch sensor includes a film substrate 100, a first touch electrode region 121, a second touch electrode region 122, and a first gap region 111.

The film substrate 100 is a flexible substrate and acts as a carrier for support, protection and the like. A material of the film substrate 100 may be polyethylene terephthalate (PET) or polyimide (PI), or may be other suitable polymer materials, or may be, for example, a metal substrate or the like. The film substrate 100 may adopt a glossy base or a matte base, or may adopt a base having functions of anti-scratches, anti-Newton rings, anti-reflection (high-transparent treatment) and the like, and for example, a surface treatment may be performed on the base to obtain the above functions.

The first touch electrode region 121 and the second touch electrode region 122 are arranged side by side on the film substrate 100. For example, the first touch electrode region 121 and the second touch electrode region 122 include a touch electrode structure which is a self-capacitive touch electrode structure or a mutual capacitive touch electrode structure. The touch electrode structure may be a single layer structure or a multi-layer structure. For example, the touch electrode structure may include a plurality of detection electrodes arranged in an array. For example, the touch electrode structure may include a structure of electrodes in two layers that are intersected with each other and insulated from each other. A material of the touch electrode structure may be a transparent conductive material, such as indium tin oxide (ITO), or indium zinc oxide (IZO), or may be other suitable materials.

The first touch electrode region 121 and the second touch electrode region 122 are not electrically connected with each other. Certainly, the embodiments of the present disclosure are not limited thereto. The first touch electrode region 121 and the second touch electrode region 122 may also be electrically connected through an electrical wire crossing the first gap region 111 or be electrically connected in other manners. For example, the first touch electrode region 121 and the second touch electrode region 122 are electrically connected through a leading wire disposed outside the film substrate 100.

The first touch electrode region 121 and the second touch electrode region 122 may be rectangular, square, triangular or the like, or have other regular shapes or irregular shapes. The shapes of the first touch electrode region 121 and the second touch electrode region 122 may be the same or different. The areas of the first touch electrode region 121 and the second touch electrode region 122 may be equal or not equal, which may be determined as needed.

It is to be noted that the number of the touch electrode regions is not limited in the embodiments of the present disclosure, and may be two, for example, the first touch electrode region 121 and the second touch electrode region 122, or may be three, four or other numbers. The arrangement of the touch electrode regions is not limited, and may be arranged in a plurality of rows or in a plurality of columns, or may be arranged in an irregular manner.

As shown in FIG. 1 and FIG. 2, the first gap region 111 is disposed between the first touch electrode region 121 and the second touch electrode region 122 to separate the first touch electrode region 121 and the second touch electrode region 122. For example, there is no filler in the first gap region 111, so that the touch sensor is bendable along the first gap region 111 without damaging the first touch electrode region 121 and the second touch electrode region 122. Of course, the embodiments of the present disclosure are not limited thereto. For example, the first gap region 111 may also be filled with a flexible material, so that the first touch electrode region 121 and the second touch electrode region 122 are connected together as one body to improve a relative positional accuracy between the touch electrode regions in manufacturing processes and to improve the accuracy of touch detection. A shape of the first gap region 111 is determined by the relative positional relationship between adjacent touch electrode regions, and may be rectangular, or may have other suitable shapes. The number of the gap regions is not limited, and may be one or any number, which may be determined according to a bending direction and a bending position of the touch sensor.

Figure 3:
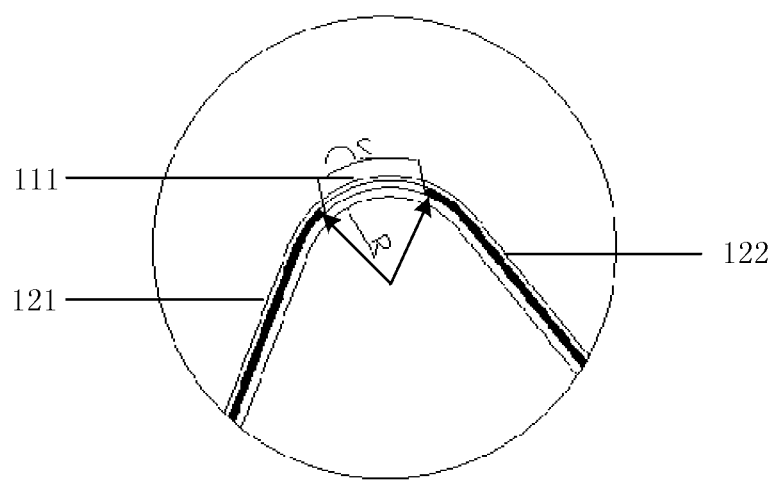
FIG. 3 is a schematic view illustrating that the touch sensor is bent according to an embodiment of the present disclosure.

FIG. 3 is a schematic view illustrating that the touch sensor is bent according to an embodiment of the present disclosure. Referring to FIG. 3, the touch sensor is subjected to an external force, and the first gap region 111 is deformed, so that the relative position between the first touch electrode region 121 and the second touch electrode region 122 is changed to achieve bending.

For example, in order to achieve a desired bending angle and avoid a touch blind zone, an interval between the first touch electrode region 121 and the second touch electrode region 122 (i.e., a width of the first gap region 111) satisfies: S≤πR, where S is the interval between the first touch electrode region 121 and the second touch electrode region 122, π is a circumference ratio and R is a bending radius. For example, in an example, S≤4 mm to allow a touch integrity and avoid stress concentrations in a bent portion. It is to be noted that, in the embodiments of the present disclosure, because the number and arrangement of the touch electrode regions are not limited, a plurality of intervals between a plurality of adjacent ones of the touch electrode regions may be the same or different, which can be determined according to the bending radius of each bending position.

The bending angle can be any angle, and the embodiments of the present disclosure does not limit thereto. For example, in an example, the bending angle is from 0 degree to 180 degrees, so that unidirectional folding can be achieved. For example, in another example, the bending angle is from −180 degrees to +180 degrees, so that folding in both forward and reverse directions can be achieved.

Figure 4:
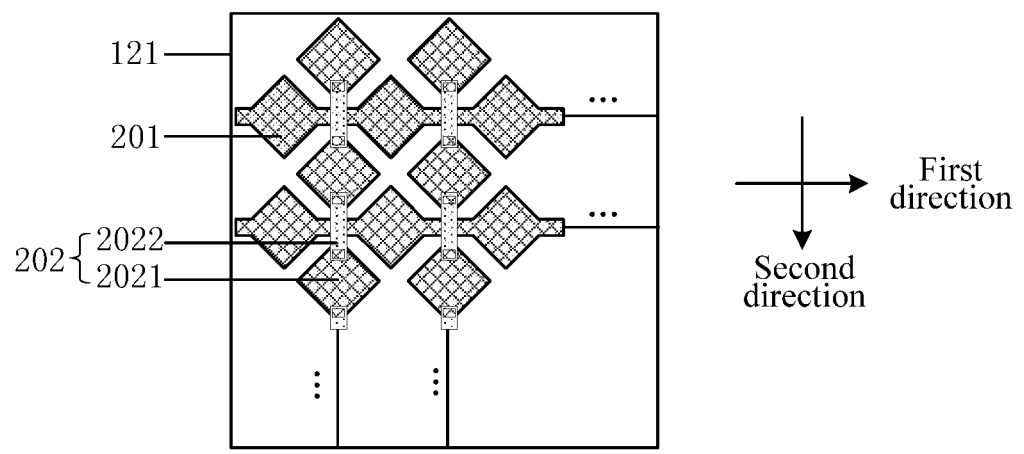
FIG. 4 is a schematic plan view of a touch electrode region of the touch sensor according to an embodiment of the present disclosure.

FIG. 4 is a schematic plan view of the touch electrode region of the touch sensor according to an embodiment of the present disclosure. Referring to FIG. 4, the first touch electrode region 121 includes touch scanning electrodes 201 and touch sensing electrodes 202, which are insulated from each other. The touch scanning electrodes 201 are arranged along a first direction, and the touch sensing electrodes 202 are arranged along a second direction intersecting the first direction. For example, the first direction and the second direction are perpendicular to each other, that is, an angle between the first direction and the second direction is 90 degrees, and embodiments of the present disclosure are not limited thereto.

For example, each touch sensing electrode 202 includes a plurality of first electrode portions 2021 and a plurality of second electrode portions 2022, and each of the touch scanning electrodes 201 extends continuously. The first electrode portions 2021 are located in a same layer as the touch scanning electrodes 201. The second electrode portions 2022 are located in a different layer (which may be a layer closer to the film substrate 100 or further away from the film substrate 100) and constitutes a bridge portion connecting adjacent first electrode portions 2021, such that the touch sensing electrode 202 crosses the touch scanning electrode 201 that intersects the touch sensing electrode 202. The shapes of the touch scanning electrodes 201 and the touch sensing electrodes 202 are not limited to the diamond block shape shown in the drawing, and may be any shape, such as a rectangle, a triangle, a circle, or the like.

It is to be noted that, in the embodiments of the present disclosure, the structures and forms of the touch scanning electrodes 201 and the touch sensing electrodes 202 are not limited. For example, in an example, the touch sensing electrodes 202 and the touch scanning electrodes 201 are located in different layers, so that the touch sensing electrodes 202 intersect with and are insulated from the touch scanning electrodes 201, without the need for the bridge portion, which is simple in manufacturing and easy to implement. For example, in another example, the touch sensing electrodes 202 extend continuously, each of the touch scanning electrodes 201 may include a first electrode portion and a second electrode portion, and the second electrode portion constitutes a bridge portion, so that the touch scanning electrode 201 crosses the touch sensing electrode 202 that intersects the touch scanning electrode 201. Herein, the first direction and the second direction may be any directions, and the angle between the first direction and the second direction is not limited to 90 degrees.

Figure 5:
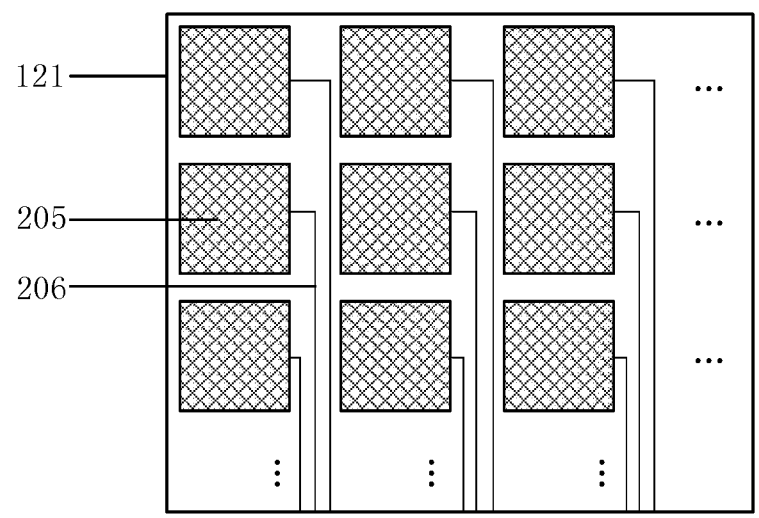
FIG. 5 is another schematic plan view of the touch electrode region of the touch sensor according to an embodiment of the present disclosure.

FIG. 5 is another schematic plan view of the touch electrode region of the touch sensor according to an embodiment of the present disclosure. Referring to FIG. 5, the first touch electrode region 121 includes a plurality of detection electrodes 205. The plurality of detection electrodes 205 are insulated from each other and arranged in an array. Each of the detection electrodes 205 is electrically connected with a corresponding signal line 206 to transmit a touch signal. The detection electrode 205 may be square or have other shapes, such as a rectangle, a circle, a hexagon, a triangle, or the like. The arrangement of the plurality of detection electrodes 205 is not limited and may be determined according to actual needs. The size of the detection electrodes 205 is not limited. For example, in an example, each of the detection electrodes 205 has a size of 5 mm*5 mm to satisfy the requirement on the detection accuracy of finger touch while minimizing the number of the detection electrodes 205.

The detection electrodes 205 and the signal lines 206 may be disposed in a same layer or in different layers. For example, in an example, the detection electrodes 205 and the signal lines 206 are disposed in a same layer, and the signal lines 206 are located between adjacent detection electrodes 205, respectively. In this way, manufacturing processes are simplified and the cost is reduced. For example, in another example, the detection electrodes 205 and the signal lines 206 are disposed in different layers, and the detection electrodes 205 cover the signal lines 206 and are electrically connected with the signal lines 206 through via hole(s), which can reduce the distance between adjacent detection electrodes 205 to avoid a touch blind zone.

Figure 6:
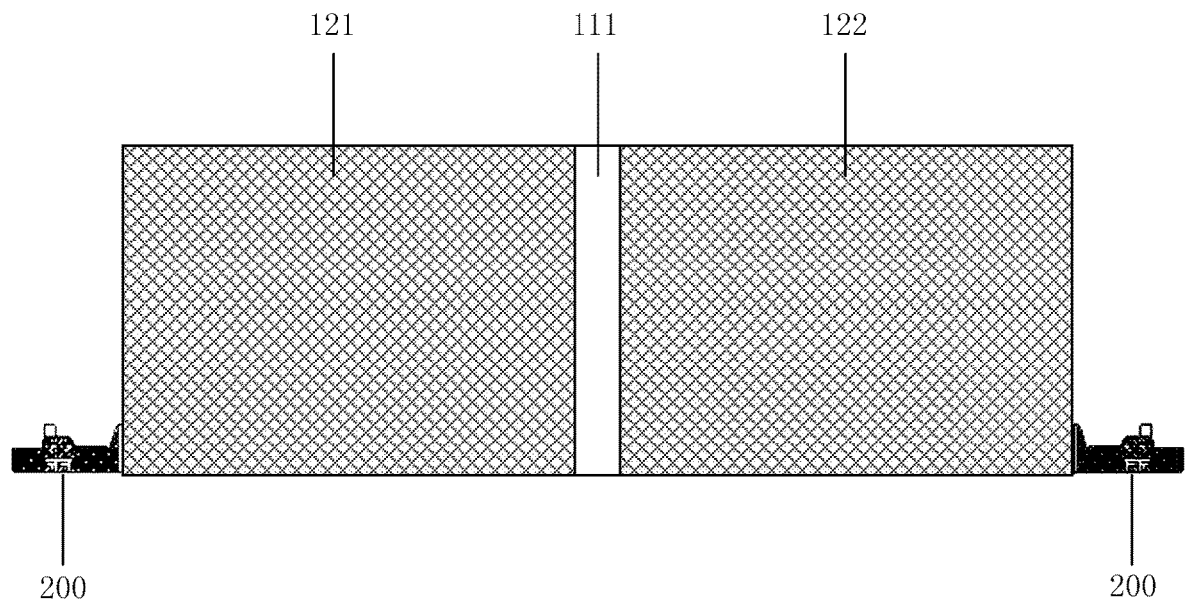
FIG. 6 is a schematic plan view of the touch sensor according to an embodiment of the present disclosure.

FIG. 6 is a schematic plan view of a touch sensor according to an embodiment of the present disclosure. Referring to FIG. 6, the touch sensor of this embodiment is substantially identical to the touch sensor described in FIG. 2 except that the touch sensor of this embodiment further includes a flexible circuit board 200. In this embodiment, two flexible circuit boards 200 are electrically connected with the first touch electrode region 121 and the second touch electrode region 122 respectively to provide signal connections. For example, the first touch electrode region 121 and the second touch electrode region 122 receive control signals from a touch driving chip (not shown in the figure) through the flexible circuit boards 200 respectively, and send detection signals to the touch driving chip through the flexible circuit boards 200, respectively.

The two flexible circuit boards 200 can be disposed at any side of the first touch electrode region 121 and the second touch electrode region 122. For example, the two flexible circuit boards 200 are at different sides of the first touch electrode region 121 and the second touch electrode region 122, to meet the requirement on flexible wirings of various types of devices. The flexible circuit board 200 may be, for example, a flexible printed circuit board formed by using a polyimide film or a polyester film as a base material.

The number of flexible circuit boards 200 is not limited and may be determined according to the number of touch electrode regions insulated from each other. For example, in an example, the touch electrode regions are insulated from each other, and the number of the flexible circuit boards 200 is equal to the number of the touch electrode regions, and the flexible circuit boards 200 are correspondingly electrically connected with the touch electrode regions in a one-to-one manner. For example, in another example, the touch electrode regions are electrically connected with each other through the electrical wires disposed on the film substrate 100 or through the leading wires disposed outside the film substrate 100, and only one flexible circuit board 200 is required and is electrically connected with any one of the touch electrode regions.

Figure 7:
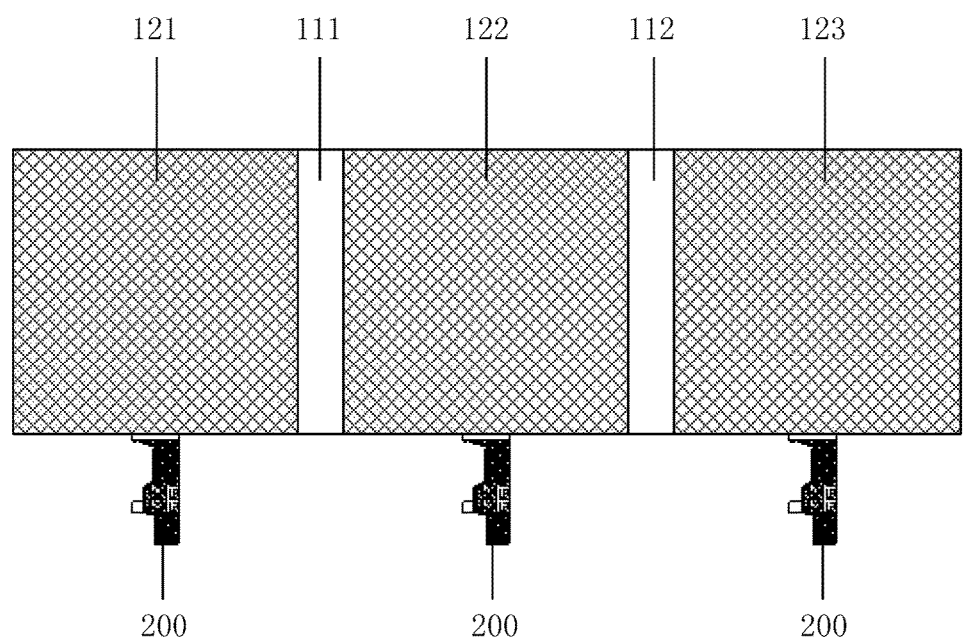
FIG. 7 is a schematic plan view of another touch sensor according to an embodiment of the present disclosure.

FIG. 7 is a schematic plan view of another touch sensor according to an embodiment of the present disclosure. Referring to FIG. 7, the touch sensor of this embodiment is substantially the same as the touch sensor described in FIG. 6, except for the number of touch electrode regions, the number of gap regions, and the number and position of the flexible circuit boards 200. In this embodiment, the touch sensor includes a first touch electrode region 121, a second touch electrode region 122 and a third touch electrode region 123. The three touch electrode regions are arranged in a row and spaced apart from each other. The first gap region 111 is disposed between the first touch electrode region 121 and the second touch electrode region 122. A second gap region 112 is disposed between the second touch electrode region 122 and the third touch electrode region 123. The touch sensor includes two gap regions 111 and 112, and it is bendable along the first gap region 111 or the second gap region 112. In this way, it has a more flexible bending manner and a wider application range. Three flexible circuit boards 200 are electrically connected with the first touch electrode region 121, the second touch electrode region 122 and the third touch electrode region 123, respectively. The flexible circuit boards 200 are located at the same side of the three touch electrode regions, which is simple in processes and convenient for manufacture.

Figure 8:
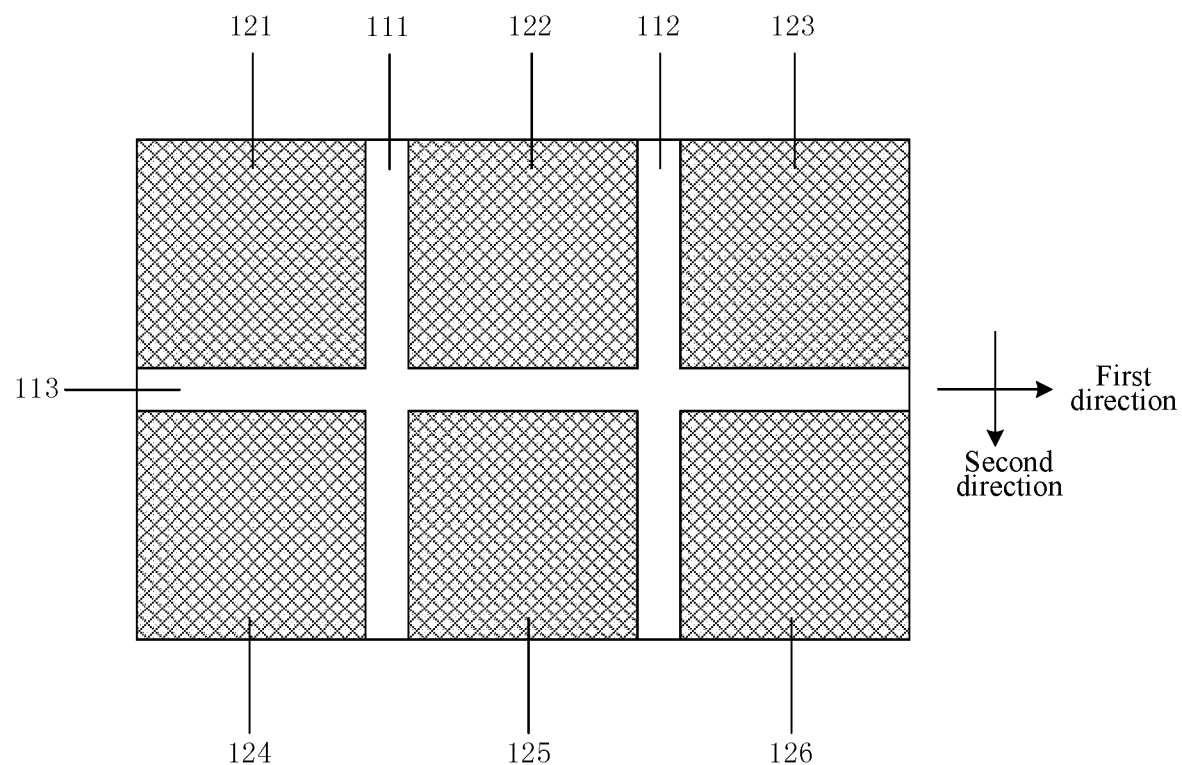
FIG. 8 is a schematic plan view of still another touch sensor according to an embodiment of the present disclosure.

FIG. 8 is a schematic plan view of another touch sensor according to an embodiment of the present disclosure. Referring to FIG. 8, the touch sensor of this embodiment is substantially the same as the touch sensor described in FIG. 2 except for the number and arrangement of the touch electrode regions, and the number and shape of the gap regions. In this embodiment, the touch sensor includes a first touch electrode region 121, a second touch electrode region 122, a third touch electrode region 123, a fourth touch electrode region 124, a fifth touch electrode region 125 and a sixth touch electrode region 126. The above six touch electrode regions are spaced apart from each other and arranged in two rows and three columns.

The first gap region 111, the second gap region 112 and the third gap region 113 are respectively distributed between adjacent two touch electrode regions and constitute a shape similar to 井. The third gap region 113 is arranged along the first direction, and each of the first gap region 111 and the second gap region 112 is arranged along the second direction. For example, the first direction and the second direction are perpendicular to each other. The angle between the first direction and the second direction may also be any angle, which is not limited by the embodiments of the present disclosure. The touch sensor is bendable along the first gap region 111, the second gap region 112, or the third gap region 113, achieving bending in both the first direction and the second direction to satisfy the various need of touch devices.

It should be noted that, in the embodiments of the present disclosure, the number and arrangement of the touch electrode regions are not limited, and the number and shape of the gap regions are not limited. The bending direction may be one or more and may be in any direction.

Figure 9:
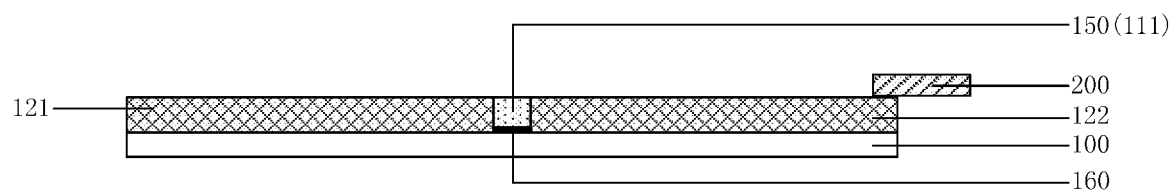
FIG. 9 is a cross-sectional view of another touch sensor according to an embodiment of the present disclosure.
Figure 10:
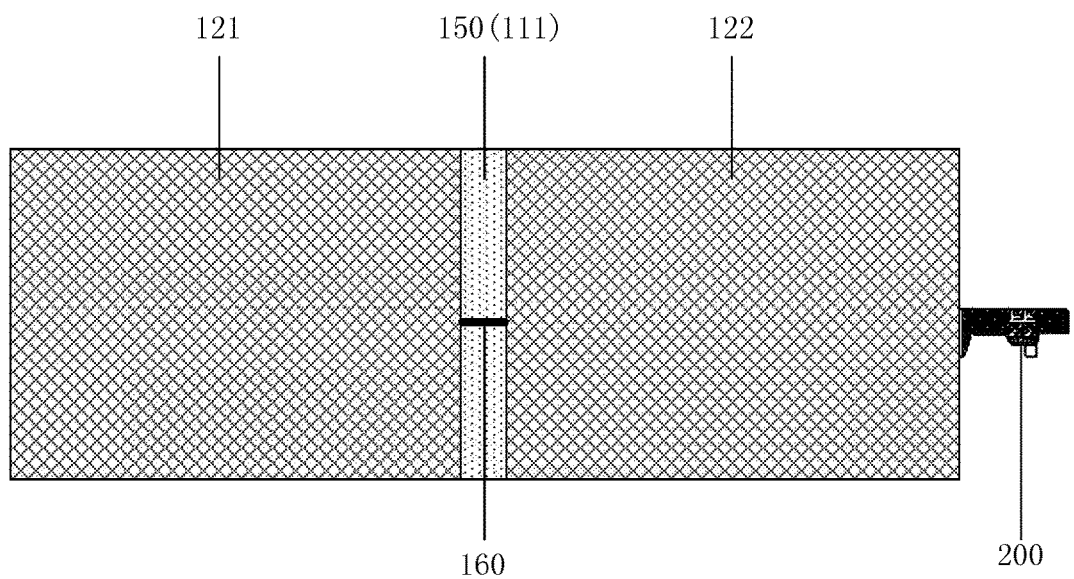
FIG. 10 is a schematic plan view of the touch sensor shown in FIG. 9 according to an embodiment of the present disclosure.

FIG. 9 is a schematic cross-sectional view of another touch sensor according to an embodiment of the present disclosure. FIG. 10 is a schematic plan view of the touch sensor shown in FIG. 9 according to the embodiment of the present disclosure. Referring to FIGS. 9 and 10, the touch sensor of this embodiment is substantially identical to the touch sensor described in FIG. 1 except that the touch sensor of this embodiment further includes a flexible connector member 150, an electrical wire 160 and a flexible circuit board 200.

In this embodiment, the flexible connector member 150 is disposed in the first gap region 111 and is insulated and connected with the first touch electrode region 121 and the second touch electrode region 122, so as to connect the first touch electrode region 121 and the second touch electrode region 122 together. This method can improve the relative positional accuracy between the touch electrode regions during the manufacturing process, and improve the accuracy of the touch detection.

The flexible connector member 150 may be formed of an organic flexible material or an inorganic flexible material.

For example, the flexible connector member 150 may be formed of a polymer material, such as PET or PI. The flexible connector member 150 may be separately prepared or may be prepared together with the first touch electrode region 121 and the second touch electrode region 122. For example, in an example, during preparing the touch electrode regions, a pattern of the touch electrode structure is avoided from the first gap region 111, so that the first gap region 111 contains only the polymer material and does not include the touch electrode structure, such that the touch electrode regions are divided into the first touch electrode region 121 and the second touch electrode region 122.

The electrical wire 160 is disposed on the film substrate 100 and extends across the first gap region 111 and is electrically connected with the first touch electrode region 121 and the second touch electrode region 122. The position where the electric wire 160 is disposed is not limited and the electrical wire 16 may be disposed at any position of the first gap region 111. The electrical wire 160 may be disposed between the film substrate 100 and the flexible connector member 150, or may be disposed in the flexible connector member 150, or may be disposed on the flexible connector member 150, which is not limited in the embodiments of the present disclosure. The material of the electrical wire 160 may be copper, aluminum, gold, silver or an alloy thereof, or may be other suitable flexible conductive materials.

The number of the electric wires 160 is not limited, and the number of the electric wire 160 between adjacent two touch electrode regions may be one or more. For example, in an example, a single electrical wire 160 is disposed between the first touch electrode region 121 and the second touch electrode region 122, which can simplify the manufacturing process while achieving the function of electrical connection. For example, in another example, a plurality of electrical wires 160 are redundantly disposed between the first touch electrode region 121 and the second touch electrode region 122, so that not only multiple touch signals can be transmitted, but also the reliability of the touch sensor is improved in the case that the touch sensor is bent for a plurality of times, avoiding the malfunction due to accidental breakage of some electric wire(s) 160.

The flexible circuit board 200 is disposed at one side of the second touch electrode region 122 and electrically connected with the second touch electrode region 122. Because the first touch electrode region 121 is electrically connected with the second touch electrode region 122 through the electrical wire 160, a single flexible circuit board 200 can realize the transmission of the touch signals. The embodiments of the present disclosure are not limited thereto. The flexible circuit board 200 may be disposed on one side of the first touch electrode region 121 and electrically connected with the first touch electrode region 121.

At least one embodiment of the present disclosure also provides an electronic device, which includes the touch sensor provided by any one of the embodiments of the present disclosure. The electronic device can be bent and is not easily damaged, which helps to achieve the foldable touch control.

Figure 11:
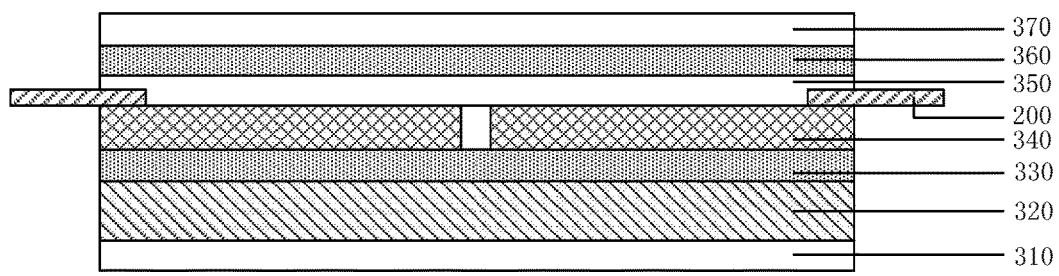
FIG. 11 is a cross-sectional view of an electronic device according to an embodiment of the present disclosure.

FIG. 11 is a cross-sectional view of the electronic device according to an embodiment of the present disclosure. Referring to FIG. 11, the electronic device includes a heat dissipation film 310, a display structure 320, an optical adhesive bonding layer 330, a touch sensor 340, a polarizer 350, a surface bonding layer 360, a flexible cover plate 370 and two flexible circuit boards 200.

The display structure 320 is configured for display according to display data, and may include a display array of organic light-emitting diodes, or include a liquid crystal display panel, an electronic paper display panel, or the like, which are not limited by the embodiments of the present disclosure. For example, the touch sensor 340 includes two touch electrode regions, and the two touch electrode regions are not electrically connected with each other. The touch sensor 340 may include a self-capacitive touch sensor or a mutual capacitive touch sensor. Of course, the embodiments of the present disclosure are not limited thereto, and the touch sensor 340 may be the touch sensor provided by any one of the embodiments of the present disclosure. The display structure 320 and the touch sensor 340 are arranged in layers. The optical adhesive bonding layer 330 is disposed between the touch sensor 340 and the display structure 320, to bond the touch sensor 340 and the display structure 320 together. The heat dissipation film 310 is disposed at a side of the display structure 320 away from the touch sensor 340, and configured for heat dissipation to ensure display performance. The two flexible circuit boards 200 are electrically connected with the two touch electrode regions of the touch sensor 340, respectively, to transmit touch signals.

The polarizer 350 is disposed on the touch sensor 340 and configured to control and adjust the emergent light. The flexible cover plate 370 acts as a protector, insulator, or the like, and may be formed of an organic or inorganic material, or may be formed of other suitable materials. The surface bonding layer 360 is disposed between the polarizer 350 and the flexible cover plate 370, to bond the polarizer 350 and the flexible cover plate 370 together. The surface bonding layer 360 may be, for example, an optical adhesive.

Figure 12:
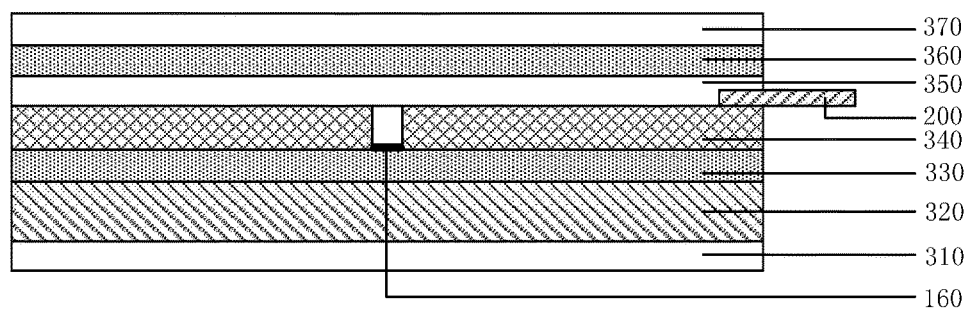
FIG. 12 is a cross-sectional view of another electronic device according to an embodiment of the present disclosure.

FIG. 12 is a schematic cross-sectional view of another electronic device according to an embodiment of the present disclosure. Referring to FIG. 12, the electronic device of this embodiment is substantially the same as the electronic device described in FIG. 11 except for the number of flexible circuit boards 200 and except that the electronic device of this embodiment further includes the electrical wire 160. In this embodiment, the touch sensor 340 includes the electrical wire 160. The electric wire 160 is disposed between the two touch electrode regions of the touch sensor 340 and is electrically connected with the two touch electrode regions. The electronic device includes one flexible circuit board 200. The flexible circuit board 200 is electrically connected with any one of the two touch electrode regions of the touch sensor 340 to transmit touch signals.

It should be noted that, in various embodiments of the present disclosure, the electronic device may include more or less structures, and the positional relationships between the structures are not limited and may be determined according to requirements, and the embodiments of the present disclosure are not limited thereto.

Figure 13:
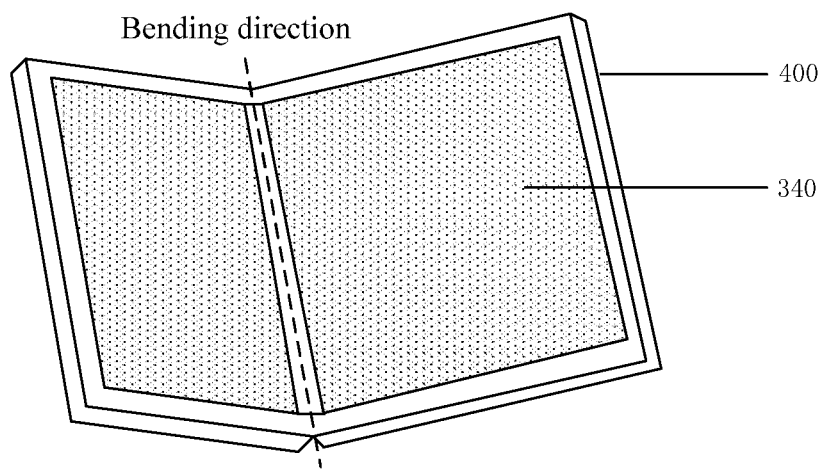
FIG. 13 is a schematic view illustrating an appearance of another electronic device according to an embodiment of the present disclosure.

FIG. 13 is a schematic view of an appearance of another electronic device according to an embodiment of the present disclosure. Referring to FIG. 13, the electronic device is a foldable mobile phone 400 which includes the touch sensor 340 provided by any one of the embodiments of the present disclosure. The foldable mobile phone 400 can be bent along the bending direction shown in the figure to provide a better user experience. Certainly, the embodiments of the present disclosure include, but are not limited to the electronic device shown in FIG. 13, and the electronic device may also be any product or component having a touch function, such as an e-book, a mobile phone, a tablet computer, a notebook computer, a game machine, a display, a digital photo frame, a navigator, or the like.

The described above are only exemplary embodiments of the present disclosure and not intended to limit the scope of the present disclosure. The scope of the present disclosure is defined by the claims.

What is claimed is:

1. A touch sensor, comprising:
   a film substrate;
   a plurality of touch electrode regions arranged side by side on the film substrate;
   wherein the plurality of touch electrode regions are spaced apart from each other by at least one gap region, and the touch sensor is bendable along the gap region, wherein an interval between two adjacent ones of the touch electrode regions is not greater than a product of a bending radius of the touch sensor and a circumference ratio.

2. The touch sensor according to claim 1, wherein the plurality of touch electrode regions are not electrically connected with each other;
   the touch sensor further comprises a plurality of flexible circuit boards, the plurality of flexible circuit boards being electrically and correspondingly connected with the plurality of touch electrode regions to provide signal connections.

3. The touch sensor according to claim 2, wherein the plurality of flexible circuit boards are on a same side or different sides of the plurality of touch electrode regions.

4. The touch sensor according to claim 1, further comprising an electrical wire, the electrical wire extending across the gap region and electrically connecting the touch electrode regions on two sides of the gap region.

5. The touch sensor according to claim 4, wherein a material of the electric wire comprises copper, aluminum, gold, silver or an alloy thereof.

6. The touch sensor according to claim 4, further comprising a flexible circuit board electrically connected with any one of the touch electrode regions.

7. The touch sensor according to claim 1, wherein the plurality of touch electrode regions are arranged in a plurality of rows or in a plurality of columns.

8. The touch sensor according to claim 1, wherein the touch electrode regions comprise a touch electrode structure, and a material of the touch electrode structure comprises a transparent conductive material.

9. The touch sensor according to claim 1, wherein the film substrate is a flexible substrate.

10. The touch sensor according to claim 1, further comprising a flexible connector member, wherein the flexible connector member is in the gap region and is connected with adjacent ones of the touch electrode regions to connect the plurality of touch electrode regions together.

11. The touch sensor according to claim 1, wherein the touch sensor comprises a capacitive touch sensor.

12. An electronic device, comprising a touch sensor, wherein the touch sensor comprises:
    a film substrate;
    a plurality of touch electrode regions arranged side by side on the film substrate;
    wherein the plurality of touch electrode regions are spaced apart from each other by at least one gap region, and the touch sensor is bendable along the gap region, wherein an interval between two adjacent ones of the touch electrode regions is not greater than a product of a bending radius of the touch sensor and a circumference ratio.

13. The electronic device according to claim 12, further comprising a display structure, wherein the touch sensor and the display structure are arranged in layers.

14. The electronic device according to claim 13, further comprising:
    an optical adhesive bonding layer provided between the touch sensor and the display structure to bond the touch sensor and the display structure; and
    a flexible cover plate provided on the touch sensor.

15. The electronic device according to claim 13, wherein the display structure comprises a display array of organic light-emitting diodes.

16. The touch sensor according to claim 5, further comprising a flexible circuit board electrically connected with any one of the touch electrode regions.

17. The touch sensor according to claim 16, wherein an interval between two adjacent ones of the touch electrode regions is not greater than a product of a bending radius of the touch sensor and a circumference ratio.

18. The touch sensor according to claim 17, wherein the plurality of touch electrode regions are arranged in a plurality of rows or in a plurality of columns.

19. The touch sensor according to claim 2, wherein the plurality of touch electrode regions are arranged in a plurality of rows or in a plurality of columns.

* * * * *